United States Patent [19]

Otsuka

[11] 4,401,506
[45] Aug. 30, 1983

[54] PROCESS FOR PRODUCING SEMICONDUCTOR DEVICE

[75] Inventor: Hideo Otsuka, Fujisawa, Japan

[73] Assignee: Tokyo Shibaura Denki Kabushiki Kaisha, Japan

[21] Appl. No.: 321,130

[22] Filed: Nov. 13, 1981

[30] Foreign Application Priority Data

Nov. 19, 1980 [JP] Japan .................. 55-162922

[51] Int. Cl.$^3$ .............................................. C30B 25/20
[52] U.S. Cl. ............................ 156/612; 156/DIG. 66
[58] Field of Search ............... 156/603, 612, 613, 606, 156/DIG. 64, DIG. 73, DIG. 88, DIG. 66; 427/86, 95; 423/348–350; 148/175, 188, 189

[56] References Cited

U.S. PATENT DOCUMENTS 3,316,121 4/1967 Lombos et al. ............... 156/613
4,203,799 5/1980 Sugawara et al. .......... 156/DIG. 64

FOREIGN PATENT DOCUMENTS 51-32272 3/1976 Japan .

OTHER PUBLICATIONS

The Identification, Annihilation, and Suppression of Nucleation Sites Responsible for Silicon Epitaxial Stacking Faults, Roxgonyi et al., Dec. 1978, J. Electrochem Soc.: Solid–State Science and Technology 1910.
High Oxygen Czochralski Silicon Crystal Growth Relationship to Epitaxial Stacking Faults, L. E. Katz et al., Jul. 1978, J. Electrochem Soc.: Solid–State Science and Technology 1151.

Primary Examiner—Hiram H. Bernstein
Attorney, Agent, or Firm—Finnegan, Henderson, Farabow, Garrett & Dunner

[57] ABSTRACT

A process for producing a semiconductor device having high quality and self-gettering action. First, oxygen ion is implanted to the surface of a silicon monocrystalline substrate. Then, it is heat treated to precipitate the oxygen ion and to thereby produce micro defects in the layer to which oxygen ion is implanted. Subsequently, an epitaxial layer is grown on the micro defect layer. The two steps after the oxygen ion implantation may be conducted in reverse order to one another.

11 Claims, 6 Drawing Figures

F I G. 1a 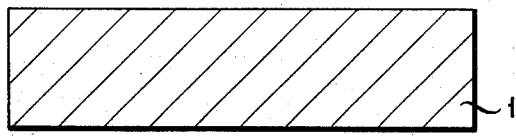
F I G. 1b 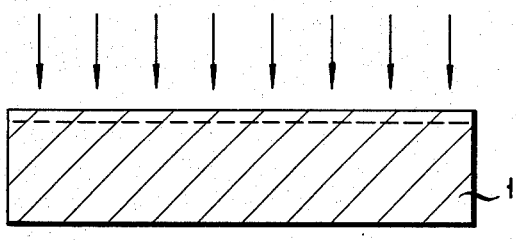
F I G. 1c 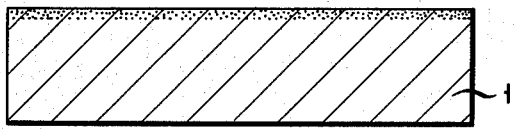
F I G. 1d 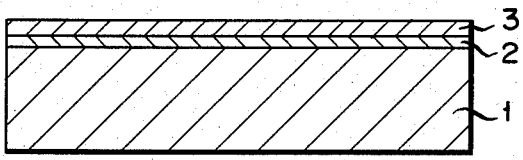

PROCESS FOR PRODUCING SEMICONDUCTOR DEVICE

BACKGROUND OF THE INVENTION

I. Field of the Invention

This invention relates to a process for producing a semiconductor device and, more particularly, to a process for producing a semiconductor device having high quality and self-gettering action.

II. Description of the Prior Art

Large scale integration and high packing density has been recently abruptly advanced for a semiconductor device. A high quality is required for a silicon monocrystalline substrate becoming a material therefor and a process for preventing the contamination thereof in a producing step is also required under such conditions. That is, it is required (1) to equalize the resistivity of the substrate crystal, (2) to employ a gettering process capable of being conducted at relatively low temperature due to the restriction of the depth of a junction, and (3) to remedy for improper memory cell holding time due to diffusion of carrier occurred in the substrate owing to a variety of improper modes of a semiconductor device such as, for example, an alpha particle soft error, an impact ionization and so forth as the respective unit element size is miniaturized.

The present invention will satisfy all these requirements as will be described. As to the above paragraph (1), since an epitaxially grown layer has highly uniform resistivity as compared with a (Czochialski-grown) monocrystal and (floating zone-grown) monocrystal, the equalization of the resistivity of the substrate crystal is conducted by employing the epitaxially grown layer.

Regarding the above paragraph (2), it relates to a gettering of impurities caused in a monocrystal during a device fabrication process (such as, for example, Cu, Te, Au or the like), and a diffusion method with phosphorus, a method of imparting mechanical damage onto the back surface of a wafer, and a method of imparting mechanical damage to the back surface of a wafer due to an ion implantation and so forth have been conducted heretofore. However, all these methods tend to contaminate the wafer and provide weak gettering capacity. Accordingly, an intrinsic gettering method (I.G. method) is taken into consideration as an excellent method. This I.G. method includes the steps of heat treating the wafer to precipitate oxygen atom contained in the crystal, thereby producing micro defects in the crystal, adsorbing the impurities in the surface of a substrate with the micro defects and thus eliminating the defects occurred with the impurities. However, as Katz et al has described on page 1,151 of "High Oxygen Czochralski Crystal Growth Relationship to Epitaxial Stacking Faults" of J. Electrochem. Soc. 125, this method is difficult to obtain uniform distribution of the micro defects made by the precipitation of the oxygen in the wafer. Further, this method has the following drawbacks and disadvantages. This is, (a) the density of the micro defects is very sensitive for the oxygen content and the heat treatment conditions for precipitating the oxygen depend much upon the crystals and cannot be determined according to only one factor. (b) It requires a heat treatment at high temperature for a long time for the formation of a non-defective surface layer. (c) The oxygen precipitation depends upon the temperature hysteresis or the like of growing the crystal, which is difficult to be controlled. (d) When a number of micro defects are produced, it becomes weak against thermal warpage.

It has been proposed to employ an ion implantation process having excellent uniformity and controllability so as to eliminate the above described drawbacks and disadvantages. Rozgonyi et al disclosed a method of gettering by implanting antimony ion on page 1,910 of "The Identification, Annihilation, and Suppression of Nucleation Sites Responsible for Silicon Epitaxial Stacking Faults" of J. Electrochem. Soc. 123. However, this method has such drawback that a part of silicon monocrystal to which antimony ion is implanted becomes N-type semiconductor. When oxygen is used for ion to be implanted, the part of silicon monocrystal to which oxygen ion is implanted does not become N-type nor P-type, and accordingly it can eliminate this drawback. A method of gettering by implanting oxygen ion to a silicon monocrystalline substrate is known and is disclosed in Japanese Patent Disclosure (Kokai) No. 51-32272. Since this method employs the ion implanted silicon monocrystalline substrate as it is without conducting a step of epitaxially growing it, a number of defects occur in the surface layer of semiconductor which should have no defect due to the ion implantation and become harmful for the junction characteristics.

SUMMARY OF THE INVENTION

Accordingly, a primary object of this invention is to provide a method of fabricating a semiconductor device having high quality and self-gettering action.

Another object of this invention is to provide a method of fabricating a semiconductor device having a uniform resistivity of a substrate crystal and no improper memory cell holding time due to the diffusion of produced carrier into a substrate owing to a variety of improper modes of the device such as, for example, an alpha particle soft error, an impact ionization and so forth.

The above and other objects of this invention will be carried out by providing a process for producing a semiconductor device which comprises the steps of implanting oxygen ion into the surface of a silicon monocrystalline substrate, precipitating oxygen by a heat treatment to thereby produce micro defects in said ion implanted layer, and forming a silicon monocrystalline epitaxially grown layer on the oxygen ion implanted layer.

BRIEF DESCRIPTION OF THE DRAWINGS

FIG. 1 is a sectional view showing the steps of producing a substrate wafer of a preferred embodiment of the method of this invention;

DETAILED DESCRIPTION OF THE PREFERRED EMBODIMENTS

Figure 2:
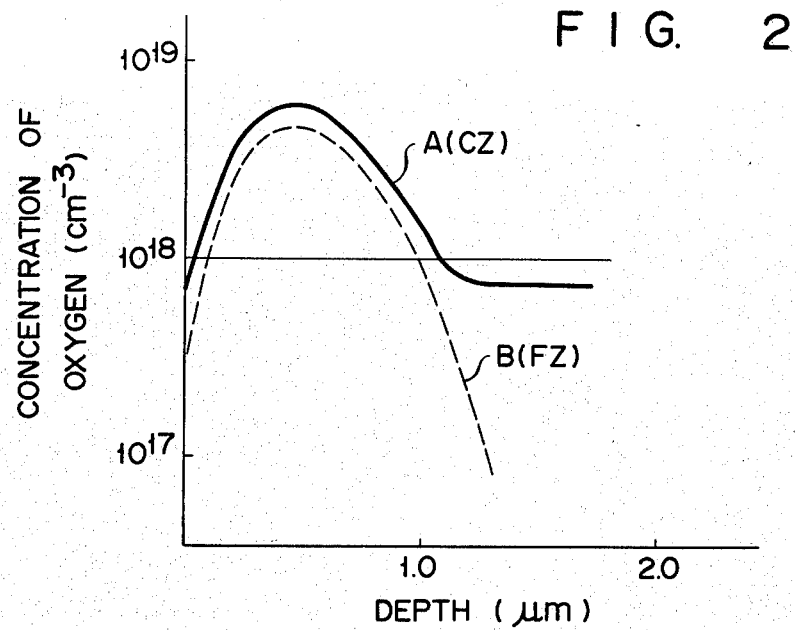
FIG. 2 is a view showing the oxygen density distribution in the substrate crystal after being epitaxially grown.

The preferred embodiment of the present invention will be described with reference to FIG. 1.

First, a silicon monocrystalline substrate is prepared as shown in FIG. 1(a). The substrate may be any of CZ monocrystal or FZ monocrystal which is mirror-finished on the surface.

As shown in FIG. 1(b), oxygen ion is implanted into the substrate. The acceleration voltage at this time is not important, and may, for example, be 150 keV. Its implantation dose may preferably be higher than $1\times10^{15}$ ions/cm$^2$, and for practical purpose, $1\times10^{15}$ to $1\times10^{16}$ ions/cm$^2$ is suitable.

As shown in FIG. 1(c), a heat treatment is conducted so as to form micro defects by precipitating oxygen. The heat treating temperature may preferably be 500° to 900° C., and the time may preferably be 1 to 30 hours. The heat treating atmosphere may be any of oxidative and non-oxidative. The oxidative atmosphere includes, for example, dry O$_2$, wet O$_2$ (steam), and the non-oxidative atmosphere includes, for example, Ar, N$_2$, H$_2$, etc.

Finally, as shown in FIG. 1(d), the silicon is epitaxially grown. An epitaxial growth process is well known in the art, and need not be explained here. The thickness of the epitaxially grown layer may preferably be 3 to 30 µm, and particularly preferably 10 to 30 µm. When the silicon is epitaxially grown, micro defect layer produced by the oxygen ion implantation is interposed between the epitaxial growth layer 3 and the substrate 1, and the epitaxial growth layer 3 becomes high quality having no impurity due to contamination nor fault. It is noted that the faults produced by the ion implantation is extinguished into the epitaxial growth layer 3. It is also noted that a suitable heat treatment may also be conducted so as to grow further micro defects after the epitaxial growth.

Though the foregoing description is directed to a process of producing a semiconductor device by the steps of heat treating after the ion implantation and then conducting the epitaxial growth, the steps may also be conducted in the reverse order to the above in the steps of conducting the epitaxial growth after the ion implantation and then conducting the heat treatment. In this case the heat treating temperature may become lower than the above process, 500° to 700° C. and the time may preferably become 4 to 15 hours.

The method of this invention has following advantages:

(a) The epitaxial growth layer has low oxygen density and no fault. Accordingly, the boundary between the defective layer and no fault layer is clear. Since the lifetime of the carrier in the micro defect layer is short and the diffusing carrier is erased, it can largely eliminate the improper mode of the aforementioned device.

(b) It can freely control the density of the micro defects.

(c) It is not necessary to take into consideration with the irregularity of oxygen density, carbon density and heat hysteresis and so forth in the substrate wafer.

(d) Since the no fault layer can be epitaxially grown, the thickness of the no fault layer can be freely controlled.

EXAMPLE

Oxygen ion was implanted in the dose of $3\times10^{15}$ ions/cm$^2$ at an acceleration voltage of 150 keV to a mirror-finished CZ crystal (having oxygen density of $7.2\times10^{17}$ atoms/cm$^3$). Then, it was heat treated at 800° C. for 2 hours in a dry O$_2$ atmosphere. Subsequently, it was epitaxially grown at 1,170° C. using SiCl$_4$ gas, and an epitaxial grown layer was grown in a thickness of 10 µm.

The curve A in FIG. 2 shows the oxygen density distribution of the wafer thus obtained. The curve B shows the oxygen density distribution of the wafer obtained by conducting similar process for an FZ monocrystal. In this case, oxygen was precipitated at the part where the oxygen density was higher than $1\times10^{18}$ atoms/cm$^3$, and the micro defects were formed therein. Accordingly, the oxygen ion implantation may be conducted by setting the peak density to higher than $1\times10^{18}$ atoms/cm$^3$.

Figure 3:
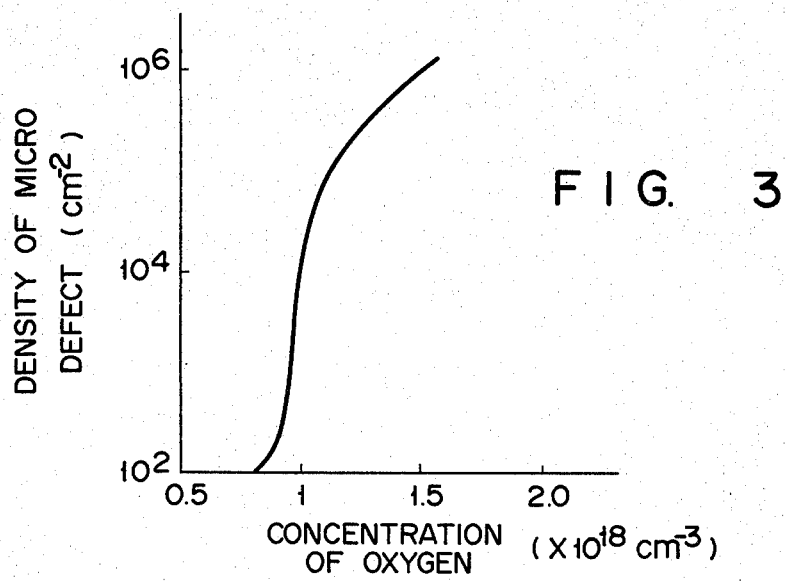
FIG. 3 is a view showing the relationship between the oxygen density and the micro defect density in the substrate crystal.

FIG. 3 shows the relationship between the oxygen density and the micro defect density in the semiconductor device produced according to the above described method. When the oxygen density is higher than $1\times10^{18}$ atoms/cm$^3$, the micro defect density exhibit a tendency of saturating. It is difficult to actually grow monocrystal with the oxygen density higher than $1\times10^{18}$ atoms/cm$^3$. Accordingly, the ion implantation is excellent at this point.

When a semiconductor device was produced as a trial with the wafer thus produced according to the above described method, the lifetime of the carrier was largely improved from 25 to 300 µsec as compared with that to which no oxygen ion was implanted.

The oxygen density used in the specification was calibrated according to a method under the condition of ASTM (American Standard of Testing and Material) F 123-81 ($2.45\times10^{17}\times$absorption coefficient (1/cm$^3$)).

What is claimed is:

1. A process for producing a semiconductor device which comprises the steps of:
implanting oxygen ions into a surface of a silicon monocrystalline substrate to an extent that said ion implanted surface still remains as a monocrystalline silicon;
precipitating said oxygen by a heat treatment thereby producing micro defects in said ion implanted surface; and
forming a silicon monocrystalline epitaxial growth layer on said ion implanted surface.

2. The process according to claim 1, wherein said oxygen ion is implanted into the surface of the silicon monocrystalline substrate to an extent that said ion implanted surface still remains as a monocrystalline silicon; then a heat treatment is conducted to precipitate the oxygen and to produce micro defects in said ion implanted surface; and then a silicon monocrystalline epitaxial growth layer is formed on the ion implanted surface.

3. A process for producing a semiconductor device which comprises the steps, in the order mentioned, of:
implanting oxygen ions into the surface of a silicon monocrystalline substrate to the extent that said ion implanted surface still remains as a monocrystalline silicon;
forming a silicon monocrystalline epitaxial growth layer on said ion implanted surface; and
precipitating said oxygen by a heat treatment thereby producing micro defects in said ion implanted surface.

4. A process for producing a semiconductor device which comprises the steps of:
implanting oxygen ions into a surface of a silicon monocrystalline substrate;
precipitating said oxygen by a heat treatment thereby producing micro defects having an impurity-gettering effect in said ion implanted surface; and
forming a silicon monocrystalline epitaxial growth layer on said ion implanted surface.

5. The process according to claim 4, wherein said oxygen ion is implanted into the surface of the silicon monocrystalline substrate; then a heat treatment is conducted to precipitate the oxygen and to produce micro defects having an impurity-gettering effect in said ion implanted surface; and then a silicon monocrystalline epitaxial growth layer is formed on the ion implanted surface.

6. A process for producing a semiconductor device which comprises the steps, in the order mentioned, of:
implanting oxygen ions into the surface of a silicon monocrystalline substrate;
forming a silicon monocrystalline epitaxial growth layer on said ion implanted surface; and
precipitating said oxygen by a heat treatment and thereby producing micro defects having an impurity-gettering effect in said ion implanted surface.

7. The process according to claim 1, 2, 3, 4, 5 or 6, wherein said oxygen is ion-implanted with a dose of $1.0 \times 10^{15}$ to $1.0 \times 10^{16}$ ions/cm$^2$.

8. The process according to claim 1, 2, 3, 4, 5 or 6, wherein said heat treatment is conducted at 550° to 900° C. for 1 to 30 hours.

9. The process according to claim 1, 2, 3, 4, 5 or 6, wherein the thickness of said epitaxial growth layer is 10 to 30 μm.

10. The process according to claim 1, 2, 3, 4, 5 or 6, wherein said oxygen ion implantation is conducted with a dose higher than $1 \times 10^{15}$ ions/cm$^2$.

11. The process according to claim 1, 2, 3, 4, 5 or 6, wherein said heat treatment is conducted at 500° to 900° C. for 1 to 30 hours, the thickness of said epitaxial growth layer is 10 to 30 μm, and said oxygen ion implantation is conducted with a dose higher than $1 \times 10^{15}$ ions/cm$^2$.

* * * * *

UNITED STATES PATENT AND TRADEMARK OFFICE
CERTIFICATE OF CORRECTION

PATENT NO. : 4,401,506
DATED : August 30, 1983
INVENTOR(S) : Hideo OTSUKA

It is certified that error appears in the above—identified patent and that said Letters Patent is hereby corrected as shown below:

Claim 8, line 2, should read as follows:

--wherein said heat treatment is conducted at 500° to 900°--

Signed and Sealed this

Twenty-first Day of February 1984

[SEAL]

Attest:

GERALD J. MOSSINGHOFF

Attesting Officer   Commissioner of Patents and Trademarks